(12) United States Patent
Rytky

(10) Patent No.: US 8,125,793 B2
(45) Date of Patent: Feb. 28, 2012

(54) ELECTRIC CIRCUITRY ARRANGEMENT

(75) Inventor: Pekka Rytky, Oulu (FI)

(73) Assignee: Polar Electro Oy, Kempele (FI)

( * ) Notice: Subject to any disclaimer, the term of this patent is extended or adjusted under 35 U.S.C. 154(b) by 389 days.

(21) Appl. No.: 12/431,038

(22) Filed: Apr. 28, 2009

(65) Prior Publication Data

US 2009/0284937 A1    Nov. 19, 2009

(30) Foreign Application Priority Data

May 16, 2008   (FI) ...................................... 20085468

(51) Int. Cl.
*H01K 1/14* (2006.01)

(52) U.S. Cl. ........................................................ 361/792

(58) Field of Classification Search ................... 361/792; 257/773
See application file for complete search history.

(56) References Cited

U.S. PATENT DOCUMENTS

| | | | | |
|---|---|---|---|---|
| 2,900,580 | A * | 8/1959 | Beck ............................. | 174/262 |
| 4,064,552 | A * | 12/1977 | Angelucci et al. ............ | 361/795 |
| 4,567,543 | A * | 1/1986 | Miniet .......................... | 361/749 |
| 4,698,729 | A * | 10/1987 | Riesner et al. ................ | 361/716 |
| 4,872,934 | A * | 10/1989 | Kameda ........................ | 156/250 |
| 4,873,764 | A * | 10/1989 | Grimm ......................... | 29/830 |
| 5,097,390 | A * | 3/1992 | Gerrie et al. .................. | 361/784 |
| 5,142,448 | A * | 8/1992 | Kober et al. .................. | 361/751 |
| 5,144,534 | A * | 9/1992 | Kober ........................... | 361/751 |
| 5,418,688 | A * | 5/1995 | Hertz et al. ................... | 361/790 |
| 5,430,614 | A * | 7/1995 | Difrancesco .................. | 361/785 |
| 5,452,182 | A * | 9/1995 | Eichelberger et al. ........ | 361/749 |
| 5,506,514 | A * | 4/1996 | Difrancesco ............... | 324/754.2 |
| 5,615,088 | A * | 3/1997 | Mizumo ....................... | 361/749 |
| 5,812,387 | A * | 9/1998 | Lu et al. ........................ | 363/144 |
| 5,933,343 | A * | 8/1999 | Lu et al. ........................ | 363/144 |
| 6,060,332 | A * | 5/2000 | Martin .......................... | 438/25 |
| 7,773,386 | B2 * | 8/2010 | Yamashita et al. ............ | 361/749 |
| 2005/0190531 | A1 * | 9/2005 | Gall et al. ..................... | 361/600 |
| 2005/0211464 | A1 | 9/2005 | Byun et al. | |
| 2006/0139902 | A1 * | 6/2006 | Happoya ....................... | 361/760 |
| 2006/0164349 | A1 | 7/2006 | Hu | |
| 2008/0047737 | A1 | 2/2008 | Sahara et al. | |
| 2009/0086450 | A1 * | 4/2009 | Matsui .......................... | 361/761 |
| 2010/0214741 | A1 * | 8/2010 | Takada et al. ................. | 361/688 |
| 2011/0050657 | A1 * | 3/2011 | Yamada ........................ | 345/204 |

FOREIGN PATENT DOCUMENTS

| | | |
|---|---|---|
| EP | 1594353 A1 | 11/2005 |
| JP | 200360353 A | 2/2003 |
| JP | 2007305636 A | 11/2007 |
| WO | W02005101934 A1 | 10/2005 |

* cited by examiner

*Primary Examiner* — Tulsidas C Patel
*Assistant Examiner* — Vladimir Imas
(74) *Attorney, Agent, or Firm* — Hoffmann & Baron, LLP

(57) ABSTRACT

An electric circuitry for a portable electronic device is presented. The electric circuitry includes a first printed circuit board comprising at least one electrical component attached to and extending from a surface of the first printed circuit board. The electric circuitry further comprises a second printed circuit board arranged to be coupled with the first printed circuit board and comprising at least one recess or hole arranged to receive the at least one electrical component extending from the surface of the first printed circuit board when the first circuit board and the second printed circuit board are coupled to each other.

24 Claims, 3 Drawing Sheets

ELECTRIC CIRCUITRY ARRANGEMENT

CROSS-REFERENCE TO RELATED APPLICATION

This application claims priority based on Finnish Patent Application No. 20085468, filed May 16, 2008, which is incorporated herein by reference.

BACKGROUND

1. Field

The invention relates to printed circuit boards for use in portable electronic devices.

2. Description of the Related Art

In the art, both rigid and flexible printed circuit boards are known. A flexible printed circuit board refers to a flexible circuit board capable of bending without breaking. Rigid circuit boards are 'conventional' circuit boards having a rigid structure which provides mechanical support for electronic components assembled on the circuit board.

In the field of small-sized electronic devices, miniaturization of electronics is essential. Therefore, reduction in the physical size of electrical components and their layout in the electronic device have to be optimized. Advantageously, the miniaturization should be achieved with minimal additional implementation and manufacturing costs in order to keep the price of the device competitive. Accordingly, there is a need for reducing the physical size of electronics in electronic devices without complicating the manufacturing process of the electronic device.

SUMMARY

An object of the invention is to provide an electronic circuitry which is optimized in terms of the size of the circuitry without complicating the manufacturing process.

According to an aspect of the present invention, there is provided an electronic circuitry as specified in claim 1.

According to another aspect of the present invention, there is provided a manufacturing method of an electronic circuitry as specified in claim 11.

According to yet another aspect of the invention, there is provided a portable electronic device according to claim 18.

Embodiments of the invention are defined in the dependent claims.

The invention provides several advantages. First of all, the physical size of the electrical circuitry is reduced. Therefore, the size of devices housing the electrical circuitry may be reduced, which leads to more compact portable devices. Furthermore, the miniaturization is achieved with means that do not complicate the manufacturing of the electrical circuitry significantly. The manufacturing process of the electrical circuitry may be modified to include an additional step, i.e. no modification of existing steps is necessarily needed. Therefore, the implementation of the invention for industrial production is achieved with minor modifications in the manufacturing process. Accordingly, the electrical circuitry according to the invention may be manufactured in practice without any additional costs.

BRIEF DESCRIPTION OF THE DRAWINGS

Embodiments of the present invention are described below, by way of example only, with reference to the accompanying drawings, in which.

DETAILED DESCRIPTION

The following embodiments are exemplary. Although the specification may refer to "an", "one", or "some" embodiment(s) in several locations, this does not necessarily mean that each such reference is made to the same embodiment(s), or that the feature only applies to a single embodiment. Single features of different embodiments may also be combined to provide other embodiments.

Figure 1:
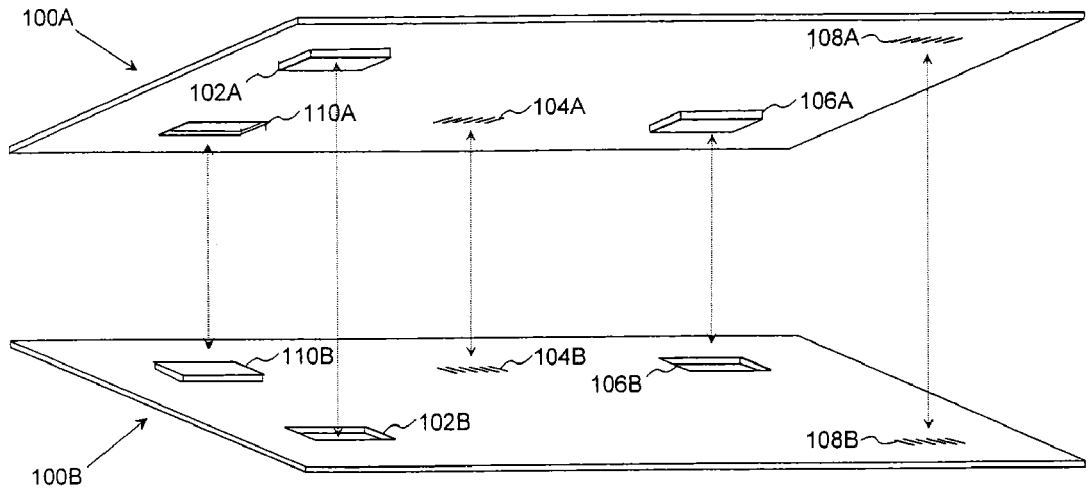
FIG. 1 illustrates an electric circuitry according to an embodiment of the invention.

FIG. 1 illustrates a generic structure of an electric circuitry according to an embodiment of the invention. FIG. 1 illustrates a first printed circuit board (PCB) 100A and a second PCB 100B, both comprising electric components disposed on the printed circuit board. The first PCB 100A comprises two electric components 102A and 106A attached to the first PCB 100A and extending from the surface of the first PCB 100A. Similarly, the second PCB 100B comprises an electric component 110B disposed on the second PCB 100B and extending from the surface of the second PCB 100B. An electric component is considered as an element having capability of modifying an electric signal. In an embodiment, the electric components 102A, 106A, 110B comprise microchips or integrated semiconductor circuits. Such components may be connected to a PCB through multiple legs. The legs may be disposed in a linear array along sides of the electric component. The number and layout of such components depends on the implementation and purpose of the electric circuitry. In other embodiment, the electric components 102A, 106A, 110B include passive electric components, such as a coil, capacitor, or resistor. Naturally, the electric components 102A, 106A, 110B may include both integrated semiconductor circuit(s) and passive component(s).

The first and the second PCB 100A, B are arranged to be coupled with each other so as to form a layered electric circuitry. Accordingly, the first and the second PCB 100A, B are arranged to be coupled against each other. In other words, the first PCB 100A is arranged to be disposed on the second PCB 100B. In order to reduce the total size of the electric circuitry, both PCBs 100A, B comprise recesses and/or holes 110A, 102B, 106B to receive the electric components 110B, 102A, 106A, respectively, when the PCBs are coupled with each other, as FIG. 1 illustrates. The recesses may be formed by milling, and the holes may be formed by drilling.

In an embodiment, only the larger electric components, such as microchips, in one PCB are arranged in recesses of the other PCB when the two PCBs are coupled against each other to form the layered structure.

Additionally, the PCBs 100A, 100B may comprise bonding areas 104A, B, 108A, B to establish a connection between the PCBs 100A, B when the PCBs 100A, B are coupled to each other. The bonding areas 104A, B, 108A, B may be arranged to establish an electric connection between the PCBs 100A, B and, therefore, they may each comprise an electric connector to establish the electric connection. The electric connector may be implemented by a plurality of electrically isolated conductors. The spatial separation (pitch) of the conductors may be around 0.2 mm, for example. The PCBs 100A, B may be coupled to each other by first applying an anisotropic conductive adhesive on the bonding areas 104A, B, 108A, B and then bringing the printed circuit boards in connection with each other. The anisotropic conductive adhesive ensures a firm mechanical connection between the PCBs and electrical connection between the corresponding conductors of the bonding areas while preventing the electrical connection (short circuit) over the adjacent conductors on the same bonding area.

Figure 2:
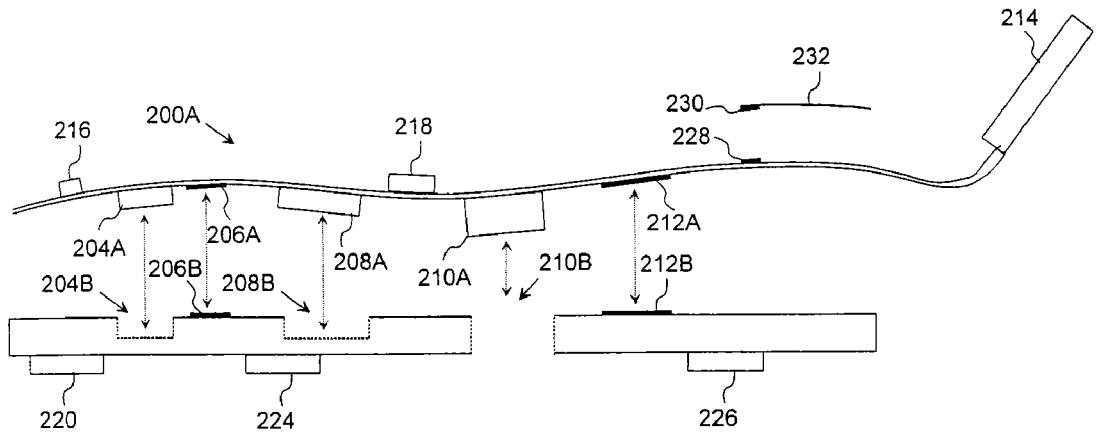
FIG. 2 illustrates two printed circuit boards according to embodiments of the invention before the two printed circuit boards are coupled with each other.

FIG. 1 illustrates two rigid PCBs, but the invention is not limited to the rigid circuit boards. FIG. 2 illustrates an exploded cross-sectional view of an electric circuitry according to an embodiment of the invention. This embodiment comprises two PCBs 200A, 200B of which a first PCB 200A is a flexible PCB and a second PCB 200B is a rigid PCB. Thus, the electric circuit according to this embodiment implements a rigid-flex PCB. The flexible PCB 200A comprises electrical components 204A, 208A, 210A on a first side or face of the first PCB 200A. The electrical components 204A, 208A, 210A are attached to the surface of the first PCB 200A and are extending from the surface of the first PCB, thereby causing an uneven profile of the first PCB 200A. The first PCB 200A may also comprise electrical components 216, 218 on the other side of the PCB 200A.

The first PCB 200A may additionally comprise bonding areas 206A, 212A to establish an electrical connection with the second PCB 200B. The first PCB 200B may also comprise another bonding area 228 on the other side of the first PCB 200A. The other side is the one not facing the second PCB 200B. This bonding area 228 is arranged to establish an electrical connection with an electro luminescent film or panel 232 configured to function as a backlight for a display element 214 connected to the first PCB 200A through a flexible electrical connector. The display element 214 may be an LCD (liquid crystal display) cell. The electro luminescent film 232 also comprises a bonding area configured as a counterpart for the bonding area 228 on the first PCB 200A.

The second PCB 200B is a rigid PCB comprising recesses 204B, 208B to receive the two smaller electrical components 204A, 208A of the first PCB 200A and a hole 210B to receive the larger electrical component 210A disposed on the first PCB 200A. The rigid PCB 200B may also comprise electrical components 220, 224, 226 at least on the side other than that facing the first PCB 200A. The second PCB 200B also comprises bonding areas 206B, 212B to connect with the respective bonding areas 206A, 212A on the first PCB 200A.

Figure 3:
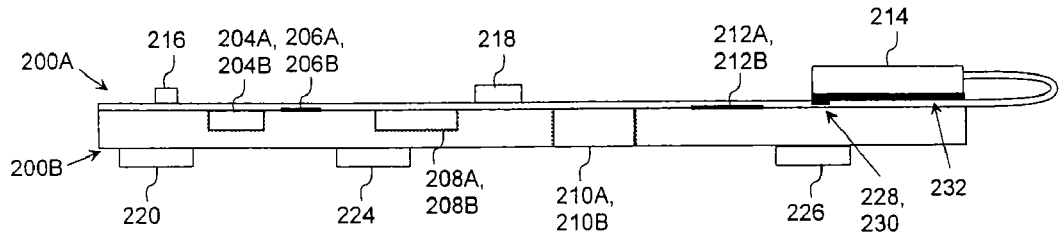
FIG. 3 illustrates the two printed circuit boards of FIG. 2 after the two printed circuit boards are coupled with each other.

FIG. 3 illustrates a cross-sectional view of the electric circuit of FIG. 2 after the two PCBs 200A, 200B have been coupled with each other to form a layered (sandwich) structure. The recesses 204B, 208B and the hole 210B accommodate the electrical components 204A, 208A, 210A extending from the flexible PCB 200A to such an extent that the surfaces of the two PCBs 200A, B are in contact with each other at least on the bonding areas 206A, B, 212A, B. The PCBs 200A, B may be attached to each other on the bonding areas 206A, B, 212A, B by the anisotropic conductive adhesive. Additionally, a bonding area 230 of the electro luminescent film 232 is attached to the bonding area 228 of the flexible PCB 200A, and the display device 214 may be turned over to the electro luminescent film 232 to form a display unit for the electronic device.

The embodiment described above comprises the flexible PCB 200A and the rigid PCB 200B. In another embodiment, both PCBs are flexible PCBs, wherein at least one of the PCBs comprises electrical components attached to the PCB and extending from the surface of the PCB to form an uneven surface. The other PCB then comprises recesses or holes to conform to the irregular surface of the first PCB. Naturally, both flexible PCBs may comprise electrical components extending from the surface of the PCB and recesses and/or holes to receive the electrical components when the PCBs are coupled with each other. In this manner, the total size of the flexible electrical circuitry may be reduced.

Figure 4:
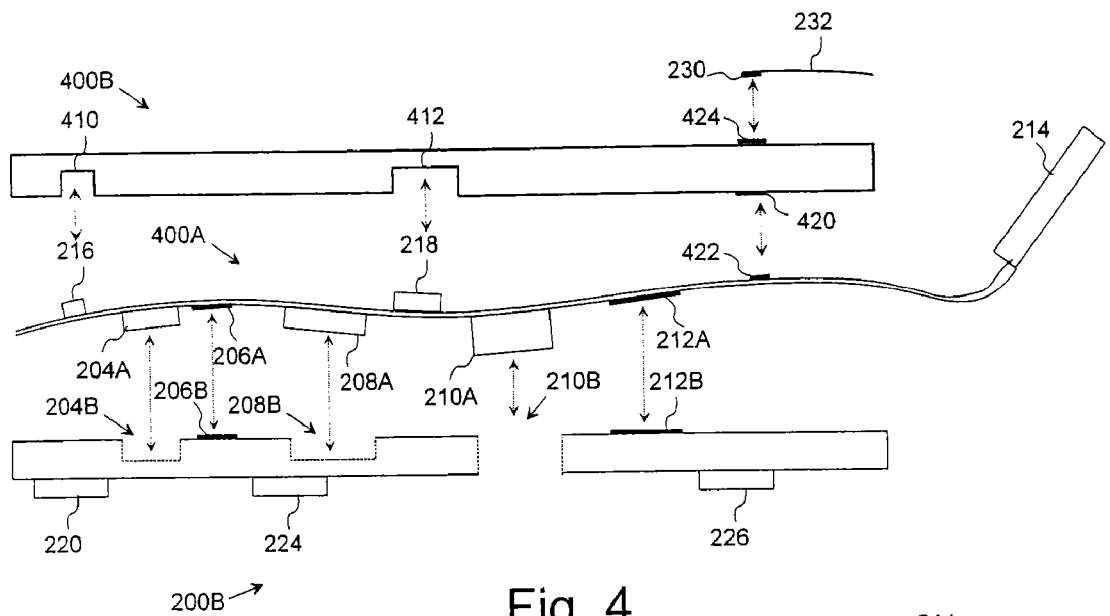
FIG. 4 illustrates a layered structure of three printed circuit boards according to embodiments of the invention before the printed circuit boards are coupled with each other.
Figure 5:
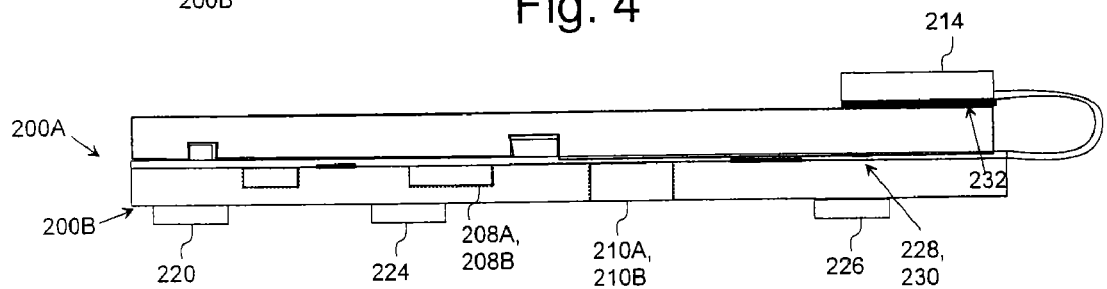
FIG. 5 illustrates the three printed circuit boards of FIG. 4 after the printed circuit boards are coupled with each other.

FIGS. 4 and 5 illustrate yet another embodiment of the invention, which is a further modification of the embodiment illustrated above with reference to FIGS. 2 and 3. In this embodiment, a third PCB 400B is arranged on top of the flexible first PCB 400A, i.e. the first PCB 400A is arranged between two other PCBs in the layered electric circuitry. Accordingly, the first PCB 400A of this embodiment is a modification of the first PCB 200A of the embodiment of FIGS. 3 and 4 in the sense that it connects to two PCBs instead of one PCB and one electro luminescent film 232. In this embodiment, the first PCB 400A comprises electrical components on both faces of the first PCB 400A, wherein components 216, 218 are disposed on the face arranged to couple with the third PCG 400. The third PCB 400B comprises recesses 410, 412 disposed on the surface of the third PCB 400B such that the recesses 410, 412 receive the components 216, 218 when the PCBs 400A, B are coupled with each other. Instead of or in addition to the recesses 410, 412, the third PCB 400B may comprise holes to accommodate the electrical components of the first PCB 400A. The third PCB 400B may additionally comprise a first bonding area 420 to establish the electric connection with a corresponding bonding area 422 of the first PCB 400A. Additionally, the third PCB comprises a second bonding area 424 to establish an electric connection with the bonding area 230 of the electro luminescent film 232.

FIG. 5 illustrates the electric circuitry of FIG. 4 after the PCBs and the display unit have been coupled with each other. Accordingly, the recesses 410, 412 in the third PCB 400B accommodate the electrical components 216, 218 of the flexible first PCB 400A, and the electro luminescent film 232 is disposed on the third PCB 400B by connecting the bonding areas 230, 424 together by the anisotropic conductive adhesive. The display element 214 is then placed on the electro luminescent film 232 to form the display unit for the electronic device.

The electronic circuitry may comprise electrical components related to the operation of a portable electronic device. The electrical components in the electronic circuitry may comprise components required to implement features of the portable electronic device and control circuits to control the overall operation of the portable electronic device. The electrical components may implement a clock, a calendar, a timer, a heart rate monitor, a motion sensor, etc. Accordingly, the electronic circuitry according to any embodiment described above may be applied to the portable electronic device which may be a wearable electronic device, an electronic sensor device for sports activities, or a portable communication device, for example. An example of the wearable electronic device is a wrist-worn electronic device, such as a sports watch configured to communicate with a wearable sensor device configured to monitor the heart rate, for example. In case of such a wrist-worn electronic device, the embodiment comprising the two flexible circuit boards may be advantageous in the sense that electronic circuitry may also be included in a strap of the wrist-worn device. Accordingly, the strap may comprise the electronic circuitry according to the embodiment, in which two (or more) flexible circuit boards are coupled to each other such that components extending from one flexible circuit are received by recesses and/or holes of another flexible circuit board. Another example of the wearable electronic device is the wearable sensor device.

Figure 7:
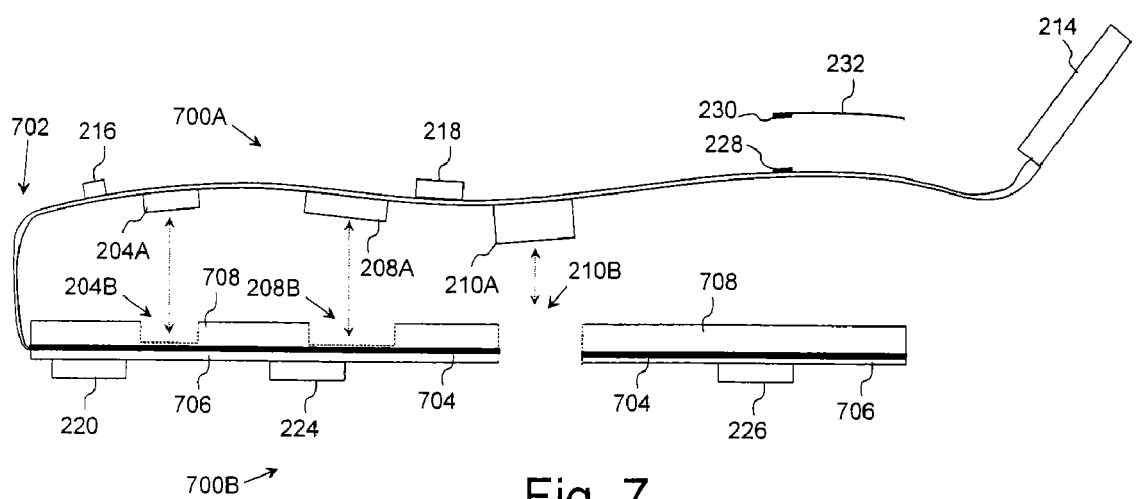
FIG. 7 illustrates a layered structure printed circuit boards according to yet another embodiment of the invention before the printed circuit boards are coupled with each other.
Figure 8:
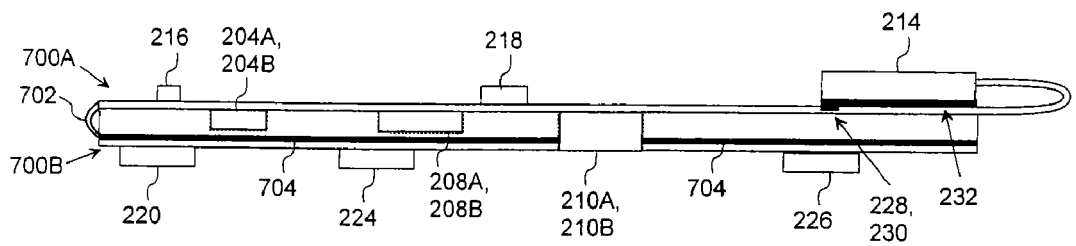
FIG. 8 illustrates the printed circuit boards of FIG. 7 after the printed circuit boards are coupled with each other.

FIGS. 7 and 8 illustrate yet another embodiment of the invention. FIG. 7 illustrates an explosion view of an electric circuitry according to this embodiment, and FIG. 8 illustrates the electric circuitry after layers of the circuitry have been coupled with each other to form the layered sandwich structure. In this embodiment, a flexible PCB 704 is provided as a layer between two rigid PCBs 706, 708 in order to form a rigid-flex PCB 700B. Rigid-flex PCBs as such are commonly known in the art and, thus, manufacturing of the rigid-flex PCB 700B is not discussed herein in greater detail. The flexible PCB comprised in the rigid-flex PCB 700B may be connected to a flexible PCB 700A comprising the extending electric components 204A, 208A, 210A through a flexible connector 702. The flexible connector 702 may provide a permanent connection between the flexible PCBs 700A, 704 such that the flexible PCBs 700A, 704 in practice form a single flexible PCB, or the connector 702 may be coupled to either flexible PCB 700A, 704 detachably. Accordingly, the bonding areas 206A, B and 212A, B illustrated in the embodiment of FIG. 2 may be omitted, because the electric connection between the flexible PCB 700A and the rigid-flex PCB 700B is established through the flexible connector 702. Optionally, the bonding areas may naturally be implemented also in this embodiment, if the flexible connector 702 does not provide sufficient connections between the PCBs 700A, B.

Figure 6:
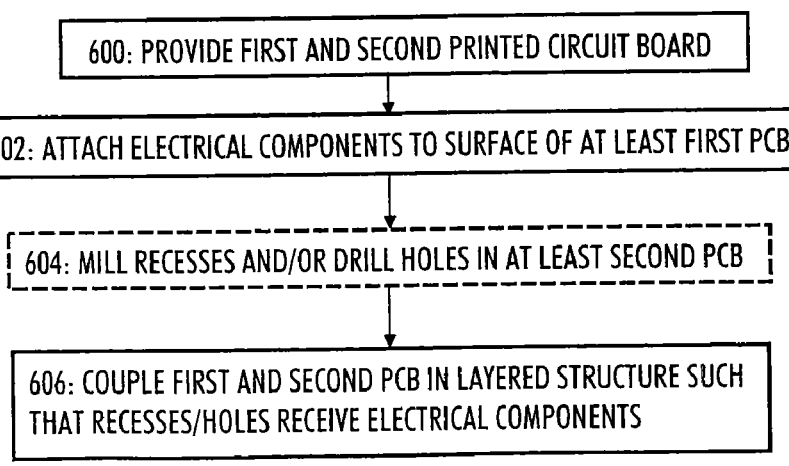
FIG. 6 is a flow diagram illustrating a manufacturing process of the electric circuitry according to an embodiment of the invention.

FIG. 6 illustrates a process for producing the electric circuitry according to an embodiment of the invention. In block 600, a first and a second PCB are provided. The PCBs may be manufactured according to PCB manufacturing methods known in the art, and the PCBs may be custom-made for a specific purpose, e.g. for use in the portable electronic device described above. Accordingly, the wiring and layers of the PCBs may be designed according to the implementation. Bonding areas may also be arranged on the surfaces of the PCBs to provide a connection between the PCBs when they are coupled together.

In block 602, electrical components are attached to a surface of at least the first PCB. The electrical components may be attached according to a layout specifically designed for the portable electronic device housing the electric circuitry. Obviously, electrical components may also be attached to the surface of the second PCB. At least part of the electrical components attached to the PCB(s) extend from the surface of the PCB(s).

In block 604, recesses are milled and/or holes are drilled in at least the second PCB according to a layout corresponding to the layout of the electrical components extending from the surface of the first PCB. Similarly, recesses may be milled and/or holes drilled in the first PCB according to a layout corresponding to the layout of the electrical components extending from the surface of the second PCB. Block 604 may be included in block 600, in which case block 604 as a separate block may be omitted. This is a typical implementation, i.e. the recesses and holes are formed in connection to manufacturing of the PCBs. When block 604 is carried out, the order between blocks 602 and 604 may also be reversed.

In block 606, the first and the second PCB are coupled to each other to form a layered structure such that the recesses and/or holes in the PCB(s) receive the extending electrical components of the other PCB. The coupling may be arranged by contacting the corresponding bonding areas of the PCBs together with an anisotropic conductive adhesive, for example, to form the electric connection between the PCBs.

As technology advances, the inventive concept can be implemented in various ways. The invention and its embodiments are not limited to the examples described above but may vary within the scope of the claims.

The invention claimed is:

1. An electric circuitry, comprising:
a first printed circuit board comprising at least one electrical component attached to and extending from a surface of the first printed circuit board; and
a second printed circuit board arranged to be coupled with the first printed circuit board in a layered structure and comprising at least one recess or hole arranged to receive the at least one electrical component extending from the surface of the first printed circuit board when the first circuit board and the second printed circuit board are coupled to each other to form the layered structure, the second printed circuit board comprising at least one electrical component attached to and extending from a surface of the second printed circuit board, the first printed circuit board comprising at least one recess arranged to receive the at least one electrical component extending from the surface of the second printed circuit board when the first circuit board and the second printed circuit board are coupled to each other.

2. The electric circuitry of claim 1, wherein the first printed circuit board is a flexible printed circuit board.

3. The electric circuitry of claim 1, wherein the first printed circuit board and the second printed circuit board are both flexible printed circuit boards.

4. The electric circuitry of claim 1, further comprising a third printed circuit board, wherein the first printed circuit board is arranged to be coupled between the second printed circuit board and the third printed circuit board.

5. The electric circuitry of claim 4, wherein the first printed circuit board comprises one or more electrical components attached to and extending from the surface on both faces of the first printed circuit board and wherein the third printed circuit board comprises at least one recess or hole arranged to receive the at least one electrical component extending from the surface of the first printed circuit board when the first circuit board and the third printed circuit board are coupled to each other.

6. The electric circuitry of claim 4, further comprising a bonding area in each printed circuit board, wherein each bonding area is arranged to contact a bonding area of another printed circuit board to provide an electrical connection between the printed circuit boards.

7. The electric circuitry of claim 6, wherein two bonding areas in contact with each other are bonded by an anisotropic conductive adhesive.

8. The electric circuitry of claim 6, further comprising a display element coupled to the first printed circuit board by a flexible conductor, wherein the display element is arranged to be disposed on top of the layered structure of printed circuit boards.

9. The electric circuitry of claim 1, wherein the second printed circuit board comprises a rigid layer and a flexible layer.

10. A method for manufacturing an electric circuitry, comprising:
providing a first printed circuit board comprising at least one electrical component attached to and extending from a surface of the first printed circuit board;
providing a second printed circuit board comprising at least one recess or hole;
coupling the first printed circuit board to the second printed circuit board to form a layered structure such that the at least one recess or hole in the second printed circuit board receives the at least one electrical component extending from the surface of the first printed circuit board;
providing the second printed circuit board with at least one electrical component attached to and extending from a surface of the second printed circuit board;
providing the first printed circuit board with at least one recess or hole; and
coupling the first printed circuit board and the second printed circuit board to each other such that the at least one recess or hole in the first printed circuit board receives the at least one electrical component extending from the surface of the second printed circuit board.

11. The method of claim 10, further comprising:
providing a third printed circuit board; and
coupling the first printed circuit board between the second printed circuit board and the third printed circuit board.

12. The method of claim 11, further comprising:
providing the first printed circuit board with one or more electrical components attached to and extending from the surface on both faces of the first printed circuit board; and
providing the third printed circuit board with at least one recess arranged to receive the at least one electrical component extending from the surface of the first printed circuit board when the first circuit board and the third printed circuit board are coupled to each other.

13. The method of claim 10, further comprising:
arranging a bonding area in each printed circuit board, wherein each bonding area is arranged to contact with a bonding area of another printed circuit board to provide an electrical connection between the printed circuit boards.

14. The method of claim 13, further comprising bonding two bonding areas in contact with each other by an anisotropic conductive adhesive.

15. The method of claim 10, further comprising:
coupling a display element to the first printed circuit board by a flexible conductor, wherein the display element is arranged to be disposed on top of the layered structure of printed circuit boards.

16. An apparatus comprising:
a first printed circuit board comprising at least one electrical component attached to and extending from a surface of the first printed circuit board; and
a second printed circuit board arranged to be coupled with the first printed circuit board in a layered structure and comprising at least one recess or hole arranged to receive the at least one electrical component extending from the surface of the first printed circuit board when the first circuit board and the second printed circuit board are coupled to each other to form the layered structure, the second printed circuit board comprising at least one electrical component attached to and extending from a surface of the second printed circuit board, the first printed circuit board comprising at least one recess arranged to receive the at least one electrical component extending from the surface of the second printed circuit board when the first circuit board and the second printed circuit board are coupled to each other.

17. The apparatus of claim 16, wherein the first printed circuit board is a flexible printed circuit board.

18. The apparatus of claim 16, wherein the first printed circuit board and the second printed circuit board are both flexible printed circuit boards.

19. The apparatus of claim 16, further comprising a third printed circuit board, wherein the first printed circuit board is arranged to be coupled between the second printed circuit board and the third printed circuit board.

20. The apparatus of claim 19, wherein the first printed circuit board comprises one or more electrical components attached to and extending from the surface on both faces of the first printed circuit board and wherein the third printed circuit board comprises at least one recess or hole arranged to receive the at least one electrical component extending from the surface of the first printed circuit board when the first circuit board and the third printed circuit board are coupled to each other.

21. The apparatus of claim 19, further comprising a bonding area in each printed circuit board, wherein each bonding area is arranged to contact a bonding area of another printed circuit board to provide an electrical connection between the printed circuit boards.

22. The apparatus of claim 21, wherein two bonding areas in contact with each other are bonded by an anisotropic conductive adhesive.

23. The apparatus of claim 21, further comprising a display element coupled to the first printed circuit board by a flexible conductor, wherein the display element is arranged to be disposed on top of the layered structure of printed circuit boards.

24. The apparatus of claim 16, wherein the second printed circuit board comprises a rigid layer and a flexible layer.

* * * * *